(12) United States Patent
Voldman et al.

(10) Patent No.: US 6,198,136 B1
(45) Date of Patent: *Mar. 6, 2001

(54) SUPPORT CHIPS FOR BUFFER CIRCUITS

(75) Inventors: Steven H. Voldman, South Burlington; James M. Never, Essex Junction, both of VT (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/618,658

(22) Filed: Mar. 19, 1996

(51) Int. Cl.$^7$ .................................................. H01L 23/62
(52) U.S. Cl. .......................... 257/357; 257/723; 257/777
(58) Field of Search .................................. 257/691, 203, 257/723, 725, 355, 357, 777

(56) References Cited

U.S. PATENT DOCUMENTS

| 4,177,358 | * | 12/1979 | Mason | 179/18 DA |
|---|---|---|---|---|
| 4,591,945 | | 5/1986 | Ugon | 361/212 |
| 4,703,483 | * | 10/1987 | Enomoto et al. | 371/24 |
| 4,958,255 | | 9/1990 | Pritchard | 361/117 |
| 5,051,807 | * | 9/1991 | Morozumi | 257/620 |
| 5,347,429 | * | 9/1994 | Kohno et al. | 361/813 |
| 5,350,941 | * | 9/1994 | Madan | 257/509 |
| 5,359,211 | | 10/1994 | Croft | 257/173 |
| 5,378,944 | | 1/1995 | Gochi | 326/62 |
| 5,392,185 | | 2/1995 | Haas et al. | 361/220 |
| 5,434,453 | * | 7/1995 | Yamamoto et al. | 257/777 |
| 5,450,277 | | 9/1995 | Wescott et al. | 361/56 |
| 5,481,133 | * | 1/1996 | Hsu | 259/777 |
| 5,644,167 | * | 7/1997 | Weiler et al. | 257/777 |

FOREIGN PATENT DOCUMENTS

| 610599A1 | * | 8/1994 | (EP) | 257/347 |
|---|---|---|---|---|
| 6094756 | * | 5/1985 | (JP) | 257/777 |
| 11-87965 | * | 7/1989 | (JP) | 257/356 |
| 7-94617 | | 4/1995 | (JP) . | |

OTHER PUBLICATIONS

"Off–Chip Electrostatic Discharege Protection", IBM TDB 32, 6B, Nov. 1989.

* cited by examiner

*Primary Examiner*—Sara Crane
(74) *Attorney, Agent, or Firm*—James M. Leas

(57) ABSTRACT

A semiconductor package contains a CMOS core integrated circuit chip, a support chip, and leads for external contact. The support chip has lead-buffer circuits such as ESD protection circuits, decoupling capacitors, drivers, and receivers, for electrical connection to the core integrated circuit chip and to the leads. By removing these lead-buffer circuits from the core chip and providing them on a separate support chip, core integrated circuit chip yield and performance are improved. Typically, the support chip is elongate and has a line of circuits, one for each pad of the core chip. Since the process technology used to build the buffer circuits is decoupled from the process technology used to build the core integrated circuit chip, a high degree of ESD protection can be provided for silicon-on-insulator chips, chips using shallow trench isolation, and for chips using very small minimum dimension lines.

21 Claims, 6 Drawing Sheets

SUPPORT CHIPS FOR BUFFER CIRCUITS

FIELD OF THE INVENTION

This invention generally relates to power rail and signal line buffer circuits for communication external to a core complementary metal oxide semiconductor (CMOS) integrated circuit chip. More particularly, it relates to a semiconductor package having buffer circuits located on a support chip adjacent to the core integrated circuit chip.

BACKGROUND OF THE INVENTION

In CMOS technology, electrostatic discharge (ESD) protection circuits are traditionally located at each signal line pad of each integrated circuit chip needing protection. ESD circuits are also sometimes located between the power supply rails of the integrated circuit chip.

Several problems arise from integrating ESD protection circuits at each signal line pad and between power supply rails. First, ESD protection circuits for chips having a large number of signal lines consume about 5 to 8% of chip area. Therefore, present ESD protection practice adds substantially to the cost of each chip. Second, as the size of devices and wiring on integrated circuit chips scales to smaller and smaller dimensions, the integrated circuit chips become more sensitive to ESD: thinner oxides, shallower junctions, narrower wiring, shorter and narrower channels and the drive to reduce parasitic leakages all tend to increase the ESD sensitivity of a chip and drive up the size and complexity of ESD protection circuits. Third, ESD protection devices built in technologies having shallow trench isolation (STI) structures for isolating adjacent active components from one another have higher resistance, and therefore do not work as well as ESD protection devices built in traditional thermally grown isolation technologies (LOCOS). To compensate for this higher resistance the ESD circuits must be made larger, again driving up manufacturing costs. Fourth, ESD protection devices formed on silicon-on-insulator (SOI) chips have been found to provide less ESD protection than ESD devices formed in bulk silicon, significantly increasing the size of ESD protection devices needed on chips having SOI to achieve ESD performance comparable to that available in traditional bulk silicon. And fifth, with each generation of chip fabrication technology, a significant effort is undertaken to reinvent and redesign ESD protection circuits to accommodate the needs of the new technology, adding to its cost and increasing the time needed to bring the new technology to market.

Potential alternatives, such as providing a portion of an SOI chip with bulk devices, add further to cost and process complexity. Further difficulties, such as crystalline defects may also thereby be introduced.

In addition to ESD circuits, other buffer circuits that are integrated at each signal line pad, such as drivers, receivers, and decoupling capacitors, use a significant amount of chip area. Particular difficulties arise in a mixed voltage environment, in which an integrated circuit chip receives or drives signal at a voltage higher than that used to operate the chip. The higher voltage puts chip yield and reliability at risk because of such well known mechanisms as hot electron degradation, dielectric breakdown, latch up, and MOSFET snapback. Circuit designers have addressed these concerns by incorporating more complex drivers and receivers into the chip, but these measures have driven up the area consumed and lowered the operational performance of the chip. Similarly, the possibility of defects in the dielectrics of large decoupling capacitors connected between power rails of high speed CMOS logic chips provides yield and reliability concerns in addition to area concerns.

A better solution is needed that provides future generations of chips with a high level of ESD protection, capable of operating in a mixed voltage environment, and capable of providing a large amount of decoupling capacitance without consuming a significant part of chip area or degrading chip yield or reliability, and this solution is provided by the following invention.

SUMMARY OF THE INVENTION

It is therefore an object of the present invention to provide ESD protection circuits and other buffer circuits, such as decoupling capacitors, drivers, and receivers, without consuming area on a core integrated circuit chip.

It is a further object of the present invention to provide ESD protection circuits for core integrated circuit chips formed in a technology for which provision of ESD protection circuits is difficult, such as SOI, without adding to process complexity.

It is a further object of the present invention to decouple the technology used for fabricating the core integrated circuit chip from the technology used to fabricate ESD protection circuits and other buffer circuits.

It is a feature of the present invention to provide buffer circuits, such as ESD protection circuits, on a separate elongate support chip adjacent the core integrated circuit chip.

These and other objects of the invention are accomplished by a semiconductor package comprising a carrier having a lead for external contact, a core integrated circuit chip and an elongate support integrated circuit chip. The elongate support chip has a length-to-width ratio of at least 4 and comprises a lead-buffer circuit electrically connected to the core integrated circuit chip and to the lead. The core chip and the support chip can be manufactured in different technologies to minimize cost.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

Figure 1:
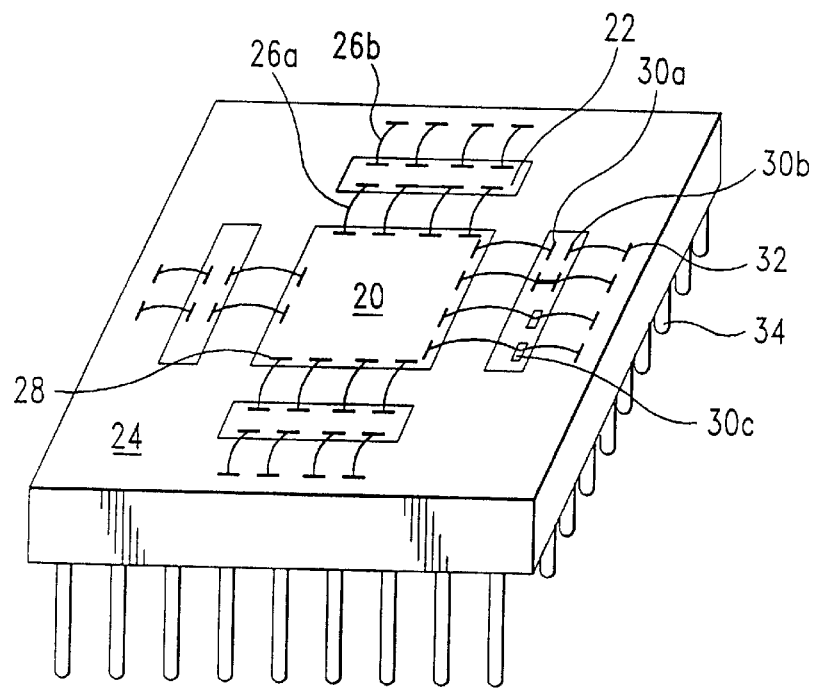
FIG. 1 is a three dimensional view of a core chip, support chips and a carrier having leads for external communication, and interconnections there between formed with wire bonds.

The present invention provides a semiconductor support chip for inclusion in a semiconductor package with at least one core integrated circuit chip. The support chip is particularly suitable for providing circuits or devices having a function related to the signal lines or power rails of the core integrated circuit chip and these circuits are designated by the term, "buffer circuits."

Included in buffer circuits are devices or circuits that control or protect power rails, such as ESD protection devices or circuits, decoupling capacitors, and voltage regulators. Similarly, buffer circuits includes devices or circuits that control, protect, or provide the signal on signal lines, such ESD protection devices or circuits, noise reduction circuits, level shifting circuits, drivers, and receivers. When buffer circuits are for connection to leads of a semiconductor package (rather than to other chips within the package) they are designated by the phrase, "lead-buffer circuits."

Core integrated circuit chips include memory and logic chips. In one embodiment of the present invention a core chip has CMOS devices and circuits, and the CMOS devices are formed using a silicon-on-insulator (SOI) process technology and shallow trench isolation. A feature of the invention is that because the buffer circuits, such as ESD circuits, are provided on a separate support chip, the support chip may be fabricated in a different technology than the core integrated circuit chip. Thus, the core integrated circuit chip and the support chip can be fabricated using different process technologies that are optimized for the requirements of the particular function of the core chip and the support chip respectively. In this embodiment, the support chip may be formed on bulk silicon using an older generation CMOS process having a larger minimum photolithographic dimension, thicker gate insulator, and LOCOS isolation. It may also be formed in an entirely different technology, such as bipolar, or on a different kind of semiconductor, such as AlGaAs.

The semiconductor support chip is preferably bonded to a carrier in a package in association with the core integrated circuit chip. In essence, the semiconductor support chip provides a buffer circuit function between different core integrated circuit chips or between the outside world and a core integrated circuit chip. As described below, the use of a support chip for this buffer circuit function that is processed in a different technology provides great advantage compared with the present practice of integrating the buffer functions onto the core CMOS integrated circuit chip itself.

The process technology used for the support chip is one that provides a high level of ESD protection, for example by providing diodes in a technology having low series resistance. By contrast, for core integrated circuit chips, transistor performance and low power consumption are key requirements, while diode series resistance is not an important consideration.

The present invention avoids the need to make trade offs between ESD protection and core integrated circuit chip performance or size. The technology used for fabricating the support chips can be optimized for ESD protection and low diode leakage by using an older technology having larger minimum dimensions and LOCOS isolation on bulk single crystal semiconductor. The technology used for fabricating the CMOS core integrated circuit chip can be optimized for speed, circuit density, and low power consumption by scaling to smaller minimum dimensions and using such advanced technologies as SOI and STI. For example, in one embodiment of the invention, the core chip is fabricated in a 0.5 micron CMOS process technology and the support chip is fabricated in a 0.8 micron CMOS process technology.

By moving ESD protection circuits off-chip, significantly improved ESD protection is realized both because larger ESD protection devices can be used and because older technology, more suitable for ESD protection circuitry, can be used. The ESD protection provided to the core integrated circuit chip by the ESD circuits located on the support chip would thereby be significantly higher than would be available were the advanced technology itself used for the ESD protection circuitry.

While permitting the use of optimized technologies for each function, the present invention also allows a reduction in the size of the core integrated circuit chip, decreasing the cost per chip by increasing the number of chips per wafer and also by increasing the proportion of good chips. About 8% of core integrated circuit chips area is saved by moving ESD protection circuits for power rails and signal leads off of the core integrated circuit chip. As will be seen below, additional area savings are achieved by moving receivers and drivers off core integrated circuit chip.

Furthermore, the investment of ESD protection development with each succeeding generation of technology can be reduced or eliminated since the old generations of technology can continue to be used for the ESD protection circuits while core integrated circuit chip technology advances independently. Similarly, improvements in ESD circuits can be implemented in support chips without redesigning or rebuilding core integrated circuit chips.

In one embodiment the support chip has an elongate shape, permitting a line of buffer circuits and their associated pads to be provided along its length, the line of pads on the support chip positioned so that they are aligned to a line of pads along an edge of the core integrated circuit chip. The line of aligned pads permits wire bond connection between core chip, support chip, and carrier. The elongate support chip uses a minimum of carrier area.

The term "elongate" as used in this application means that the length-to-width ratio is preferably at least about 4, more preferably at least 6, and even more preferably at least 8. As more fully described herein below, the elongate support chip has a width preferably in the range from about 0.2 to about 2 mm, preferably about 1 mm. The elongate support chip is preferably located along an edge of a core integrated circuit chip, and its length may be about equal to the length of that chip edge. Thus, for use with large core integrated circuit chips the ratio is likely to be significantly higher than with small core integrated circuit chips. For example, for core chips having a side of 20 mm, the length-to-width ratio of the support chip could easily be in the range of 10 to 20 or higher.

Core integrated circuit chips are fabricated on conventional bulk silicon wafers, SOI wafers, or other semiconductor wafers, such as AlGaAs. They may use isolation such as shallow trench isolation (STI) and LOCOS isolation. Core integrated circuit chips are bonded to carriers, such as ceramic substrates, including single layer and multi-layer ceramics and glass ceramics; semiconductor substrates, such as silicon substrates; lead frames; printed circuit boards; and films, tapes, and plastic layers commonly used for packaging. Carriers are usually sealed in a ceramic or plastic semiconductor package, such as a TSOP, SOJ, quad flat pack, and ball grid array, all well known in the art.

The term "signal line" is a conductor for receiving or sending a signal external to a chip. Signal lines are usually associated with a circuit such as a receiver, driver, buffer, bidirectional circuit, I/O, input, and output.

A "lead" is an electrical conductor extending from a semiconductor package for connecting circuits therein external to the package. Leads can be any of a variety of well known configurations including pins, solder bumps, gold bumps, and gull wings.

Figure 2:
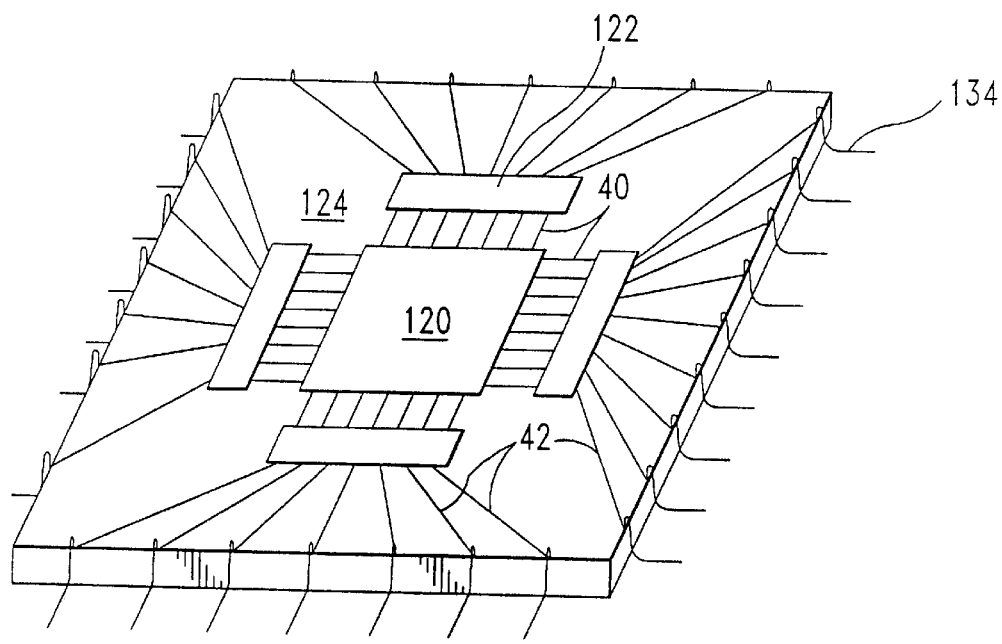
FIG. 2 is a three dimensional view of a core chip, support chips and a carrier having leads for external communication, and interconnections there between formed with surface wiring on the carrier.

FIGS. 1–2 show alternative structures of the present invention having one core integrated circuit chip and four adjacent elongate support chips. In FIG. 1, core integrated circuit chip 20 and elongate support chips 22 are bonded to ceramic carrier 24 with their active faces up. Wire bonds 26a connect signal and power pads 28 of core integrated circuit chip 20 to pads 30a or 30c on support chips 22. Wire bonds 26b connect support chip pads 30b or 30c to pads 32 on carrier 22, pads 32 being connected to leads 34. Leads 34 may extend through carrier 24 for connection to pads 32. Alternatively, wiring extending through carrier 34 may connect pads 32 with leads 34. ESD protect circuits or other lead-buffer circuits (see FIGS. 5 and 6a–6c) are located on support chips 22 and are connected to support chip pads 30a and 30b or to pads 30c.

Pads 30a and 30b tied together or single pad 30c is used for ESD protect circuit and decoupling capacitance functions. ESD circuits and decoupling capacitors are usually in a circuit connected between an externally connected pad and ground, so only a single pad (30c) is needed for the two wire bonds. Of course two connected pads (30a and 30b tied together) can also be used for the two wire bonds.

For those kinds of buffer circuits, such as receivers and drivers, for which the buffer circuit must be in series between the externally connected pad and a circuit on the core integrated circuit chip, two separate pads, 30a and 30b, are needed for each buffer circuit on support chip 22, one on either side of the buffer circuit, one for each of the two wire bonds. In this case signal goes through support circuitry connected to each pad on its way through support chip 22 to or from core integrated circuit chip 20.

FIG. 2 illustrates a "quad flat pack" implementation of the present invention. Chip 120 and elongate support chips 122 are face down on carrier 124 and connected to carrier 124 with solder bumps (not visible). Surface wiring 40 connects solder bumps of chip 120 with solder bumps of support chips 122. Surface wiring 42 connects solder bumps of support chips 122 with quad flat pack leads 134.

Figure 3A:
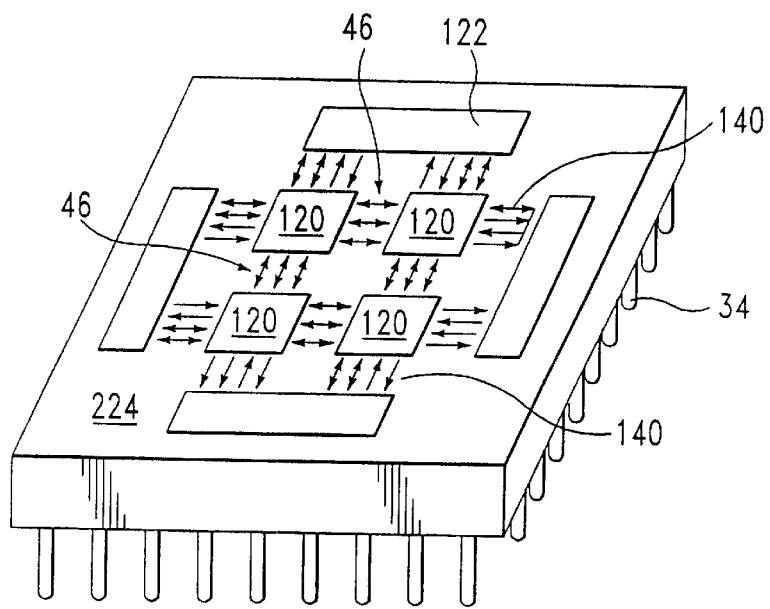
FIG. 3a is a three dimensional view of a plurality of core chips and support chips on a carrier having leads for external communication, and interconnections there between formed with solder bumps.
Figure 3B:
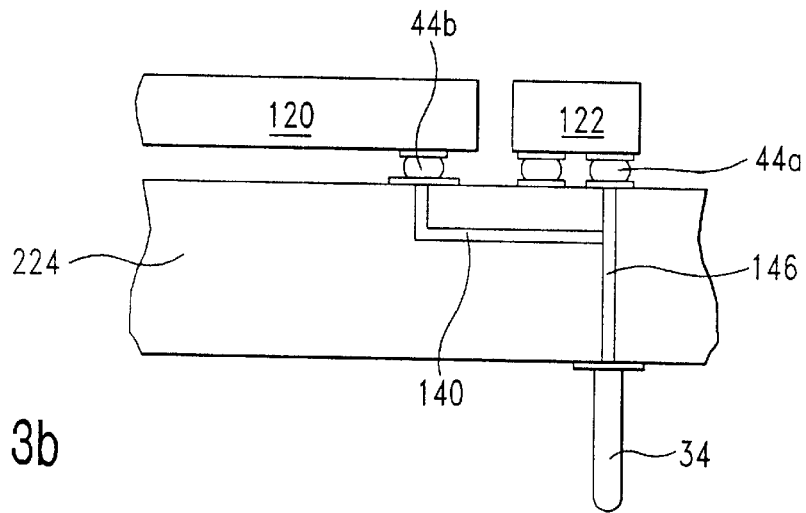
FIG. 3b is a cross sectional view through a portion of the chips and carrier of FIG. 3a showing the interconnection of a core chip, a support chip, and external leads.

FIGS. 3a–3b show several core integrated circuit chips 120 and several elongate supports chips 122, all mounted on multi-layer ceramic carrier 224 with solder bumps 44a, 44b. Conductive wires 46 (shown schematically with arrows) through metallization in multi layer ceramic carrier 224, provide for communication between chips 120. While some of that communication may be directly between chips 120, other of that communication may be buffered by a buffer circuit on one of support chips 122.

For circuits on core integrated circuit chips 120 that have signal lines that are to be tied to external leads 34 of carrier 224 and that require ESD protection circuits, solder bumps on core integrated circuit chips 120 are connected both to ESD protection circuits on support chip 122 and to leads 34 by means of carrier wiring 140 and 146 (FIG. 3b). Other circuits of core integrated circuit chips 120 that connect to other chips 120 on carrier 224, and are not for external communication through leads 34, do not require ESD protection circuits, and are not connected to ESD protection circuits on support chips 122. Thus, delays introduced by ESD protection circuits are limited to those signal lines of chips 120 for which there is actually an ESD concern, those that are to be connected to leads 34 for external communication.

Figure 4:
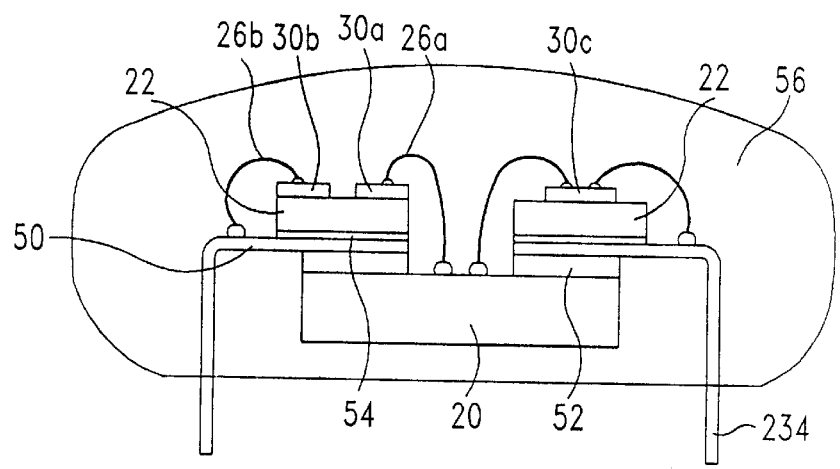
FIG. 4 is a cross sectional view of a core chip and support chips bonded to a lead frame carrier having leads for external communication, and interconnections there between formed with wire bonds.

FIG. 4 illustrates a lead frame implementation in which core integrated circuit chip 20 is bonded to lead frame 50 with adhesive 52. Support chips 22 are bonded to insulator lead frame 50 with adhesive 54. Alternatively, support chips 22 can be bonded directly to core integrated circuit chip 20 and the assembly bonded to the lead frame. Wire bonds 26a connect chip 20 to support chip 22. Wire bonds 26b connect support chip 22 to leads 234 of lead frame 50 respectively. Lead frame 50 is partially encapsulated in plastic 56, from which extend leads 234.

Elongate support chips are fabricated on conventional wafers. The wafers are sawn or cleaved into long strips, and these are then diced to the desired lengths. The elongate support chips are mounted on the carrier along with the core integrated circuit chip. It is also possible to provide carriers having pre-placed elongate support chips, ready for later placement of core integrated circuit chips.

Advantageously, support chips 122 may be longer than a single chip. As shown in FIG. 3a, support chips 122 are about as long as two chips. The length is determined by the number of signal lines required by the core integrated circuit chips. Support chips need not be wider than the space required for one or two pads or about 0.1 to 0.2 mm. Wider strips may have more mechanical strength, and more rows of buffer circuits and peripheral functions can be included, the only disadvantage being that wider strips add to the area consumed on the carrier. Thus, the width of the strip is preferably in the range from about 0.1 mm to about 2 mm, most preferably about 1 mm. The length-to-width ratio is quite high, typically in the range of about 2 or higher for a small chip having a side with a length of about 2 mm to about 20 or higher for large chips having a side with a length of about 20 mm.

Other support functions, such as decoupling capacitors, drivers, and receivers can also be integrated into the elongate support chip to provide significant improvement in core integrated circuit chip performance and yield. For example, module performance can be significantly improved with the implementation of large decoupling capacitors immediately adjacent core integrated circuit chips. While it is well known that decoupling capacitance can be integrated into the core integrated circuit chip itself, all such implementations take up chip area, reduce wafer yield, degrade the fraction of good chips because of potential capacitor defects, and similarly degrade reliability. By implementing decoupling capacitance on a separate support chip adjacent to the core integrated circuit chip, all these detractors are avoided. Capacitors include trench capacitors, metal-to-metal capacitors, and metal-insulator-semiconductor capacitors.

Figure 5:
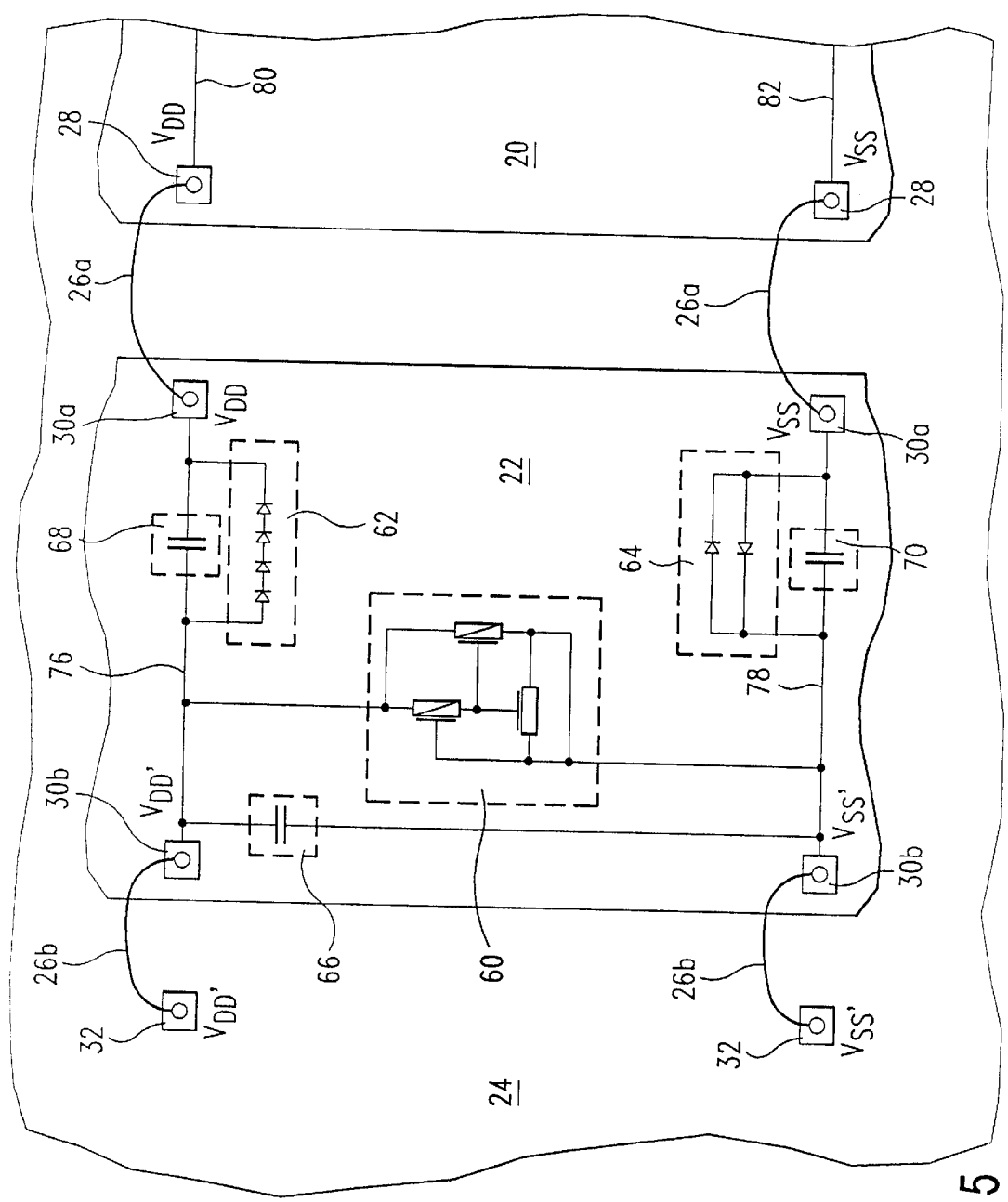
FIG. 5 is a circuit diagram showing a support chip and a core integrated circuit chip, the support chip having ESD protection circuits and decoupling capacitors and providing these functions between power rails of the core integrated circuit chip.

FIG. 5 shows an example of power rail lead-buffer circuits, including ESD protection circuits 60, 62, and 64 and decoupling capacitors 66, 68, and 70 located on support chip 22. Circuit 60 provides ESD protection, and capacitor 66 decoupling capacitance, between support chip Vdd' rail 66 and support chip Vss' rail 78. Circuit 62 provides ESD protection, and capacitor 68 decoupling capacitance, between core integrated circuit chip Vdd rail 80 and support chip Vdd's rail 76. Circuit 64 provides ESD protection, and capacitor 70 decoupling capacitance, between core integrated circuit chip Vss rail 82 and support chip Vss' rail 78. Through the three circuits, ESD protection and decoupling capacitance are provided for Vdd rail 80 to ground rail 82 on core integrated circuit chip 20. ESD protection circuits 60, 62, and 64 illustrate three of the many ESD protection circuits well know in the art. Other power rail lead-buffer circuits, such as voltage regulation can similarly be located on support chip 22. In the embodiment shown in FIG. 5, wire bonds 26a are used to interconnect pads 28 of core integrated circuit chip 20 and pads 30a of support chip 22, both chips mounted on carrier 24. Similarly, wire bonds 26b are used to interconnect pads 30b of support chip 22 with pads 32 of carrier 24 for connection with leads 34 (see FIG. 1). Of course, other packaging and interconnecting schemes, well know in the art, can also be used, including C4 bonding.

Support chip 22 may be supplied with Vdd' 76 significantly higher than Vdd 80 supplied to core integrated circuit chip 20. The higher voltage has advantage for driver circuits, but according to the present invention, the higher voltage need not be brought into the core integrated circuit chip. Support chip 22 is built in a technology designed to operate at the high voltage, eliminating the need for the core integrated circuit chip to accommodate two voltage levels. For example, support chip 22 is designed with a thicker gate dielectric to provide robust receivers and drivers. Thus, rails and signals having a higher voltage, such as 3.3, 5.0, or 10V can be brought to the support strip for use for support circuitry there, and this higher voltage is not connected to core integrated circuit chip 20.

Supplying the higher voltage exclusively to support chip 22 while operating core integrated circuit chip 20 exclusively at the low voltage has several advantages. Avoiding two power supplies on a core integrated circuit chip significantly reduced the noise brought into the chip from the system. It also avoids increased reliability concerns because of thinner dielectrics on the core integrated circuit chip.

Figure 6A:
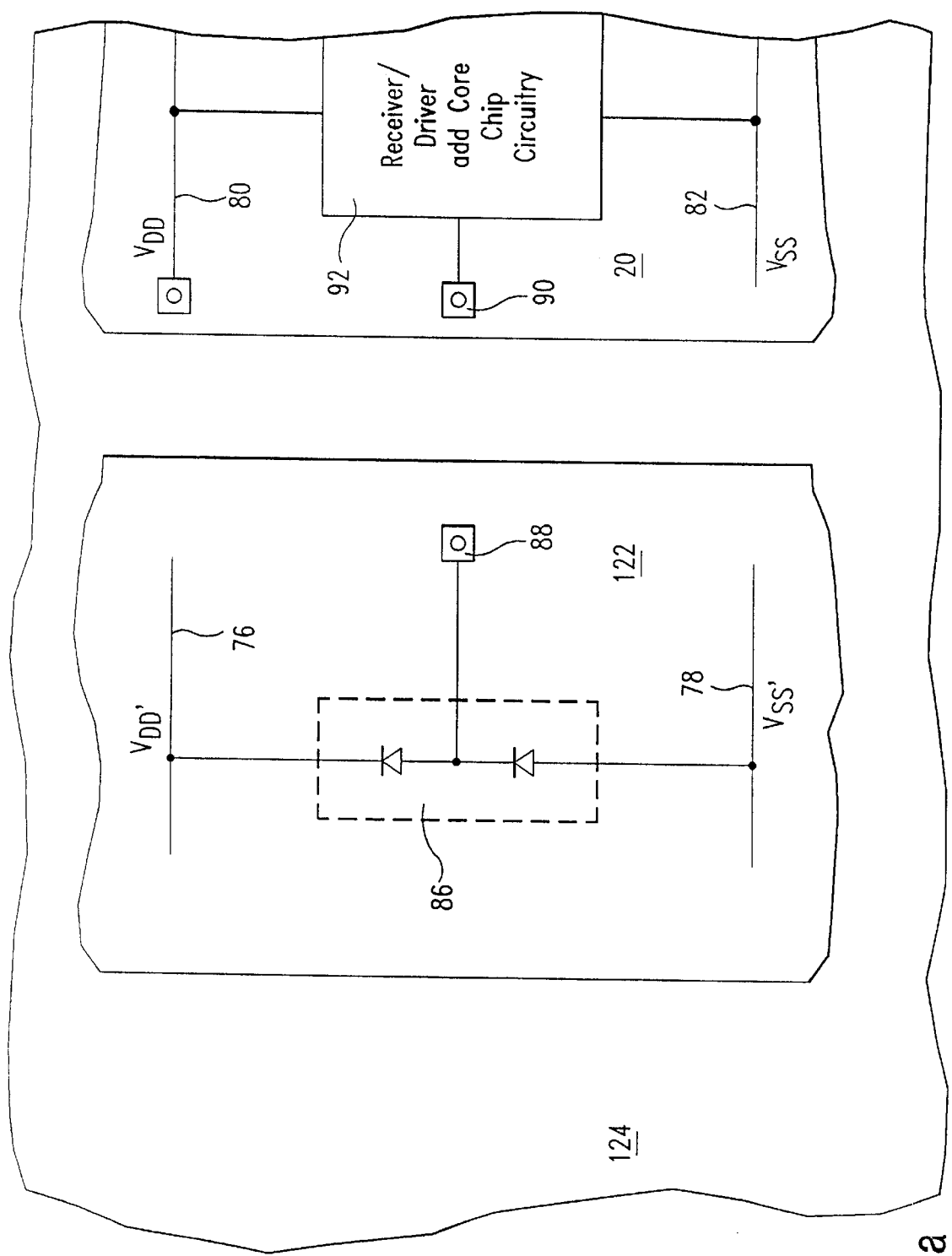
FIG. 6a is a circuit diagram showing a support chip and a core integrated circuit chip, the support chip having an ESD circuit.
Figure 6B:
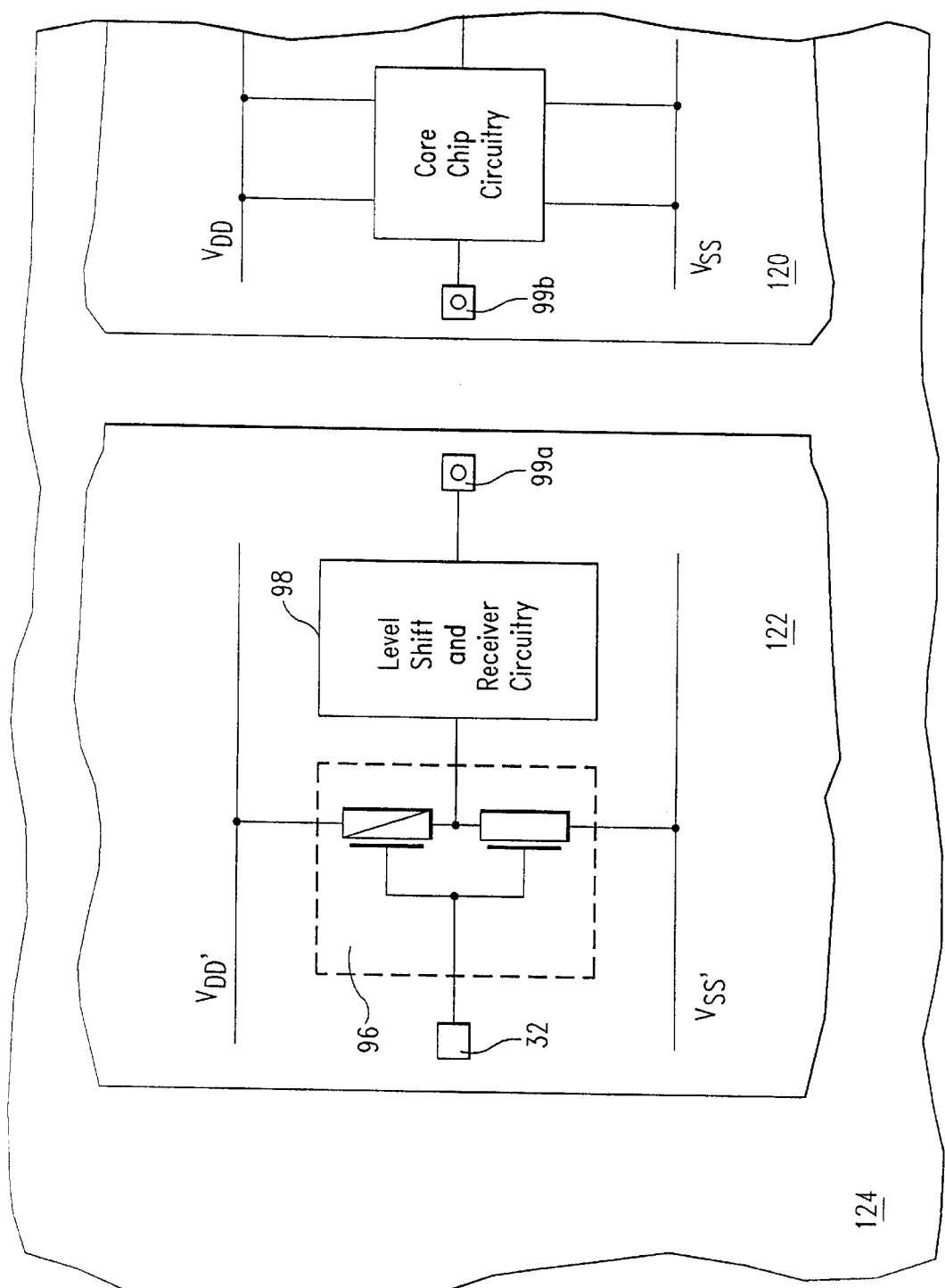
FIG. 6b is a circuit diagram showing a support chip and a core integrated circuit chip, the support chip having a receiver for the signal line connected to the core integrated circuit chip.
Figure 6C:
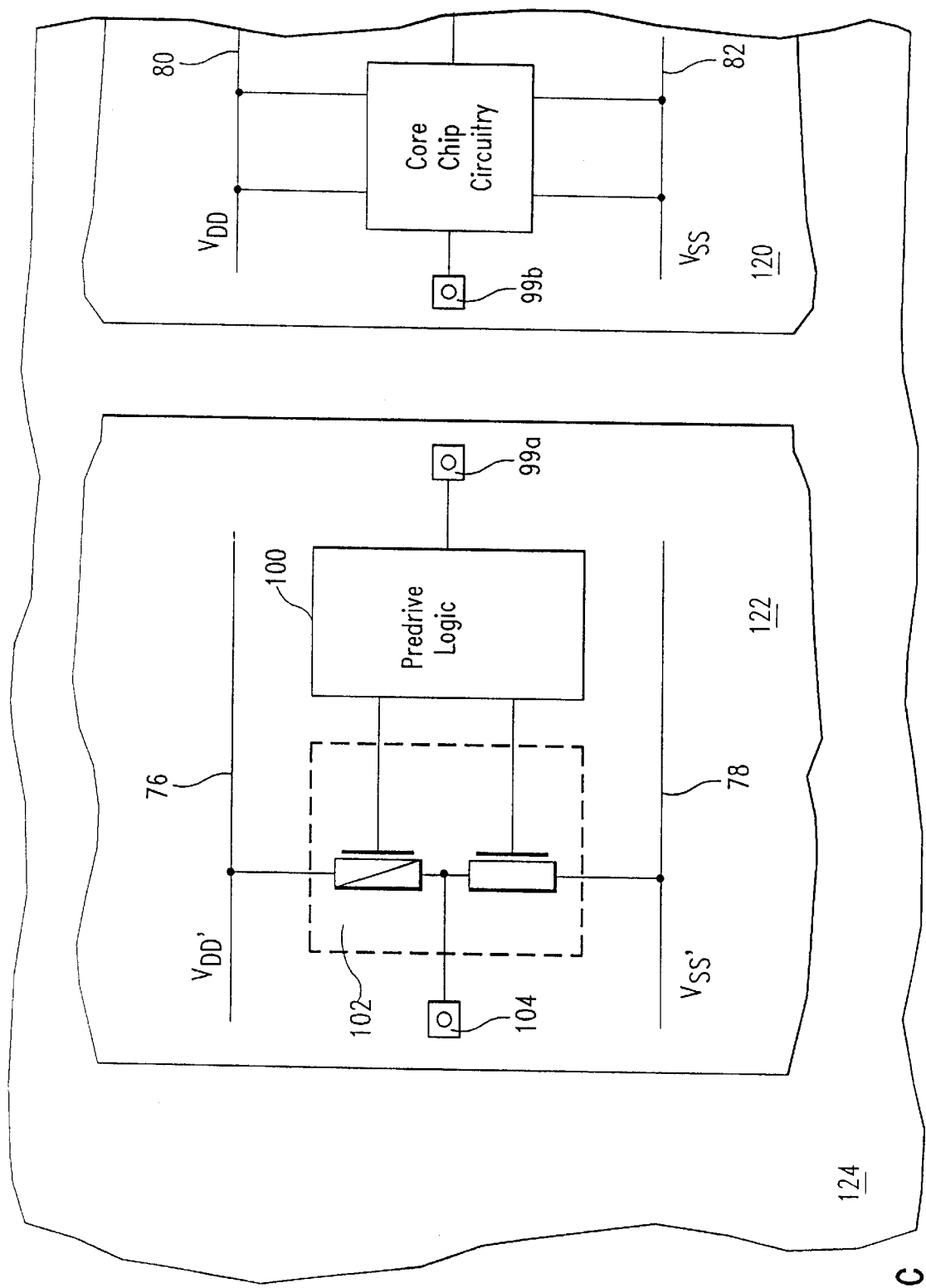
FIG. 6c is a circuit diagram showing a support chip and a core integrated circuit chip, the support chip having a driver for the signal line connected to the core integrated circuit chip.

FIGS. 6a–6c show examples of signal lead-buffer circuits, including an ESD protection circuit, a receiver circuit, and a driver circuit located on support chip 122 for core integrated circuit chip 120.

In FIG. 6a, ESD protection circuit 86, located between high voltage Vdd' (for example 5V) power rails 76 and 78 on support circuit 122, interfaces through C4 contacts 88 and 90 with receiver or driver circuit 92 on core integrated circuit chip 120. Contact 88 is also connected to lead 34 (not shown) of carrier 124. Core integrated circuit chip 120 operates at low voltage Vdd (for example, 2.5V) between power rails 80 and 82. In this embodiment, complex circuitry for receiver or driver 92 is needed to tolerate the high voltage signal that may appear on lead 34 and that therefore can be present at pads 88 and 90.

FIGS. 6b–6c illustrate the effect of moving receiver and driver circuits onto support chip 122. There, receiver circuit 96 and driver circuit 100, will have such parameters as gate dielectric thickness designed for the high voltage. Separating receiver 96 onto support chip 122, built in a technology optimized for the higher voltage, greatly simplifies receiver circuit 96, eliminating the need for such complexities as pass transistors, low Vt devices, and keeper circuits, that would be needed to provide tolerance for the high voltage were receiver 96 to be integrated into core integrated circuit chip 20. Not only have these complexities been found to add ESD reliability concerns, they have also been found to slow chip performance. Moving the receiver to the support chip is a great advantage. The receiver can now be simple, fast, and more reliable.

The high voltage signal is received on input signal line pad 32 that may be connected to lead 34 and is connected to receiver circuit 96. Level shift circuit 98 adjusts the output of receiver circuit 96 to provide a low voltage signal transmitted by way of C4 pads 99a and 99b to core integrated circuit chip 20. Thus, core chip 20 does not see the high voltage. Of course, the ESD protect circuit of FIG. 6a can be integrated into support chip 122 at pad 32.

Driver circuit 100, built in a technology designed for the high voltage and located on support chip 22, is shown in FIG. 6c. Output signal line pad 99b on core integrated circuit chip 20 sends the low voltage signal to predrive logic 100 and driver circuit 102 through pad 99a on support chip 22. Using an older technology optimized for the higher voltage, driver circuit 102 on support chip 22 does not need a stack of NFETs or PFETs that would otherwise be needed were the driver located on core integrated circuit chip 20 to provide high voltage tolerance; instead a single NFET and a single PFET are used, providing performance 20–40% higher than would be the case were mixed signal drivers used integrated on core integrated circuit chip 20. In addition, driver 102 located on support chip 22, provides output signal on pad 104 that is at higher voltage Vdd'.

While several embodiments of the invention, together with modifications thereof, have been described in detail herein and illustrated in the accompanying drawings, it will be evident that various further modifications are possible without departing from the scope of the invention. For example, a wide range of semiconductor materials can be used for both the support chip and the core integrated circuit chip. A wide range of buffer circuit functions and peripheral circuits, including redundancy, voltage regulation, decoupling capacitance, ESD protection and built-in-self test can be relocated onto support chip 22, 122. Nothing in the above specification is intended to limit the invention more narrowly that the appended claims. The examples given are intended only to be illustrative rather than exclusive.

What is claimed is:

1. A semiconductor package, comprising a carrier having:
   a core integrated circuit chip having devices fabricated in a first CMOS process technology having a first sensitivity to electrostatic discharge (ESD);
   a support integrated circuit chip having devices fabricated in a second process technology having a second sensitivity to ESD, wherein said second sensitivity is less than said first sensitivity, wherein said support chip further comprises a lead-buffer circuit comprising an ESD protection circuit; and
   a lead for external contact;
   wherein said ESD protection circuit is electrically connected to said core chip and to said lead to provide improved ESD protection to said core chip.

2. A semiconductor package as recited in claim 1, wherein said core integrated circuit chip is for operation at a lower voltage than said support chip.

3. A semiconductor package as recited in claim 1, wherein said first process technology comprises SOI and said support chip comprises bulk silicon.

4. A semiconductor package as recited in claim 1, wherein said first process technology comprises STI, said second process technology comprises LOCOS.

5. A semiconductor package as recited in claim 1, wherein said first process technology has a smaller minimum photolithographic dimension than said second process technology.

6. A semiconductor package as recited in claim 1, wherein said core integrated circuit chip is in a different semiconductor than said support integrated circuit chip.

7. A semiconductor package as recited in claim 1, wherein said support integrated circuit chip is elongate.

8. A semiconductor package as recited in claim 7, wherein said elongate support chip has a length-to-width ratio of at least 6.

9. A semiconductor package as recited in claim 7, wherein said elongate support chip has a length-to-width ratio of at least 8.

10. A semiconductor package as recited in claim 7, wherein said elongate support chip has a width less than about 2 mm.

11. A semiconductor package as recited in claim 7, the package comprising a second core integrated circuit chip, said elongate support chip further comprising a buffer circuit for electrical connection between said core integrated circuit chip and said second core integrated circuit chip.

12. A semiconductor package as recited in claim 7, wherein said support integrated circuit chip has a length-to-width ratio of at least 4.

13. A semiconductor package as recited in claim 1, wherein said core integrated circuit chip has a core integrated circuit chip pad and said support chip has a support chip pad, further wherein said support chip pad is electrically connected to said core integrated circuit chip pad, said lead, and to said ESD circuit.

14. A semiconductor package as recited in claim 1, wherein said lead-buffer circuit comprises a decoupling capacitance circuit.

15. A semiconductor package as recited in claim 14, wherein said decoupling capacitance circuit comprises one of a trench capacitor, a metal-to-metal capacitor, and a metal-oxide-semiconductor capacitor.

16. A semiconductor package as recited in claim 15, wherein said decoupling capacitance circuit is for providing decoupling capacitance between one of: a power rail of the core integrated circuit chip and a power rail of said support chip; a power rail of said support chip and a ground rail of said support chip; and a power rail of said core integrated circuit chip and a ground rail of said support chip.

17. A semiconductor package as recited in claim 1, said second process technology being different from said first process technology.

18. A semiconductor package as recited in claim 1, wherein said lead-buffer circuit comprises an ESD protection circuit.

19. A semiconductor package as recited in claim 1, wherein said lead-buffer circuit comprises one of a driver circuit and a receiver circuit.

20. A semiconductor package as recited in claim 1, wherein said core integrated circuit chip has a core integrated circuit chip pad, said support chip has a first and a second support chip pad, said lead-buffer circuit being connected to said first and said second support chip pad, further wherein said first support chip pad is connected to said core integrated circuit chip pad and said second support chip pad is connected to said lead.

21. A semiconductor package as recited in claim 17, wherein said second process technology is for operation at a different voltage than said first process technology.

\* \* \* \* \*